United States Patent

Thomas et al.

[11] Patent Number: 5,920,463
[45] Date of Patent: Jul. 6, 1999

[54] COMPONENT MOUNTING DEVICE FOR AN ELECTRICAL CONTROLLER

[75] Inventors: Gerhard Thomas, Fuerth; Karl Wutz, Sengenthal; Ehrenfried Fabry, Hersbruck, all of Germany

[73] Assignee: Robert Bosch GmbH, Stuttgart, Germany

[21] Appl. No.: 09/166,873

[22] Filed: Oct. 6, 1998

[30] Foreign Application Priority Data

Oct. 17, 1997 [DE] Germany .................. 297 18 449 U

[51] Int. Cl.[6] ........................................................ H05K 7/02
[52] U.S. Cl. .................. 361/760; 361/760; 361/765; 361/772; 361/785; 361/803; 361/728; 361/736; 361/747; 174/52.1; 174/250; 174/255; 174/260; 257/678; 257/684; 439/59; 439/60; 439/76.1; 439/76.2; 123/643
[58] Field of Search ............................ 361/760, 765, 361/767, 772, 777, 785, 801, 803, 728, 747, 736, 627, 752, 753, 600; 174/52.1, 250, 255, 260; 257/678, 684; 439/59, 60, 76.1, 76.2, 591; 123/643

[56] References Cited

U.S. PATENT DOCUMENTS

| | | | |
|---|---|---|---|
| 4,668,873 | 5/1987 | Ohba et al. | 307/9.1 |
| 4,703,397 | 10/1987 | Mioura et al. | 361/826 |
| 4,788,626 | 11/1988 | Neidig et al. | 361/715 |
| 5,079,672 | 1/1992 | Haubner et al. | 361/705 |
| 5,134,546 | 7/1992 | Izumi et al. | 361/736 |
| 5,519,252 | 5/1996 | Soyano et al. | 257/690 |
| 5,751,555 | 5/1998 | Pfizenmayer et al. | 361/763 |
| 5,828,554 | 10/1998 | Donegan et al. | 361/707 |

*Primary Examiner*—Leo P. Picard
*Assistant Examiner*—David Foster
*Attorney, Agent, or Firm*—Kenyon & Kenyon

[57] ABSTRACT

A device with components arranged on a p.c. board and attached by connector contact pads, fasteners for additionally fixing the components in place, and at least one connector strip positioned above the p.c. board surface and attached to the p.c. board, with the fasteners being structural elements molded on the connector strip, and at least one component being arranged and fixed in place between the structural elements and the p.c. board.

14 Claims, 1 Drawing Sheet

ID device for an electrical controller

COMPONENT MOUNTING DEVICE FOR AN ELECTRICAL CONTROLLER

FIELD OF THE INVENTION

The present invention relates to a device, in particular a switching and control device for motor vehicles.

BACKGROUND INFORMATION

In conventional electrical devices, vibration-sensitive components arranged on a p.c. board and soldered on via connector contact pads are additionally attached to the p.c. board by cementing with silicon or by using separate holders or cable ties. This additional mounting technique for the vibration-sensitive components usually requires additional manual operations, which entails additional cost and time outlays.

SUMMARY OF THE INVENTION

An object of the present invention is to provide a device to reliably mount components without additional structural elements or cementing steps.

According to the present invention, a connector strip, i.e., either a plug connector strip or a socket connector strip, is arranged at least partially above the surface of a p.c. board. The connector strip is preferably soldered rigidly to the p.c. board via its connector contact pads. Fasteners for attaching vibration-sensitive components are provided in the form of structural elements arranged on the bottom or the back of the connector strip. The components, which are soldered onto the p.c. board via their connector contact pads, are fastened in place on the p.c. board by the structural elements. To do this, the structural elements may merely define the position of the components, or it may be possible to clamp the components between the structural elements and the p.c. board.

One advantage of the object achieved according to the present invention is that it reduces costs by reducing the number of parts and eliminating non-reproducible manual operations. By attaching the connector strip, the components can be easily positioned on the p.c. board when mounting the connector strip and can be clamped between the connector strip and the p.c. board, depending on the arrangement of the structural elements in relation to the component size.

A further advantage of the object achieved according to the present invention is that high components can be fixed in place in the connector area, thereby making it possible to reduce the enclosure height in the remaining area of the p.c. board.

The connector strip preferably has a plug connector positioned parallel to the p.c. board surface and a socket connector positioned between the p.c. board and the plug connector, with the socket connector being provided with spacing elements between which a cavity is formed in which the at least one component is positioned. The spacing elements, which are preferably positioned on the side of the connector strip, form a cavity beneath the plug connector and between the spacing elements lying on the p.c. board, with the vibration-sensitive component, surrounded by connector contact pads of the connector strip, being positioned in this cavity. Thus, a free area of the connector strip is used for positioning the component. The advantage of this is that the connector strip can be easily mounted above the component soldered to the p.c. board and, after being correctly positioned, soldered onto the p.c. board.

In a first exemplary embodiment according to the present invention, at least one of the structural elements is a wedge with the tapered end facing the p.c. board surface for clamping the component in place. The wedge is preferably a component molded onto the socket in the form of a rib arranged vertically to the p.c. board surface. The wedge with the tapered end facing the p.c. board surface has a clamping surface in contact with the component to be clamped in place, the wedge clamping surface preferably forming an approximately 45-degree angle with the normal to the p.c. board surface. The wedge clamping surface can be used to mount the component on the p.c. board and to also press it against a further rib positioned vertically to the p.c. board surface so that the component can be easily clamped in place in the socket cavity.

In a second exemplary embodiment according to the present invention, the structural elements are angle elements arranged, in particular, parallel to the p.c. board surface, between which the components can be fixed in place by their edges. At the height of the top edge of a cuboid component above the p.c. board surface, at least two angle elements, which grip the component by its corners, are positioned on the bottom of the connector. The angle elements are preferably formed by two vertical webs arranged at an angle to one another and having an inclined surface on their lower edges facing the p.c. board so that the connector strip can be easily pushed onto the component.

In a third exemplary embodiment according to the present invention, the structural elements can have a fastening surface, in particular a concave fastening surface, which matches the outer shape of a component to be fastened in place. For example, a structural element for a cylindrical electrolytic capacitor can be a web with a circular recess arranged perpendicularly to the capacitor's axis. This enables the component to be fastened firmly in place between the p.c. board and the structural element.

The connector strip preferably has two plug connectors fastened to a bracket, and the structural elements are arranged between both plug connectors in a recess in the bracket. The cavity between the two plug connectors can thus be advantageously used by positioning large or vibration-sensitive components. The structural elements described above can be easily formed on the bracket of the two plug connectors positioned beneath the connector socket. The angle elements can also grip a side edge of the component.

In an especially advantageous exemplary embodiment according to the present invention, the device has a flat p.c. board enclosure with an elevated connector mounting area, and large components, in particular capacitors or relays, are arranged in the connector strip area. In this manner, the p.c. board can be arranged in a flat enclosure part, preferably fitted with SMDs, and large components are fixed in place vibration-free in the connector strip area by the structural elements. In doing so, the large components can be clamped in place by the structural elements only in one side edge area beneath the connector strip.

The structural elements can also be advantageously arranged entirely within the connector base area on the p.c. board. As a result, the vibration-sensitive components do not project from the sides of the connector strip, which means that the components can be fixed in place on all sides by the structural elements.

DETAILED DESCRIPTION

Figure 1:
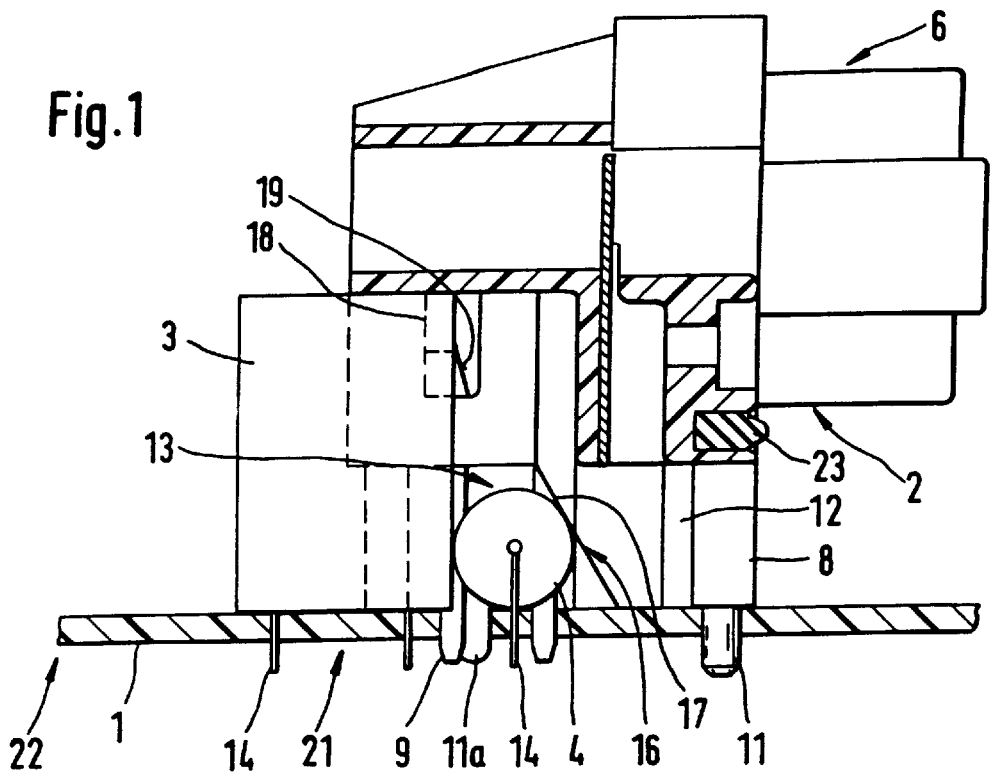
FIG. 1 shows a partially cutaway side view of the connector strip with structural elements according to the present invention.
Figure 2:
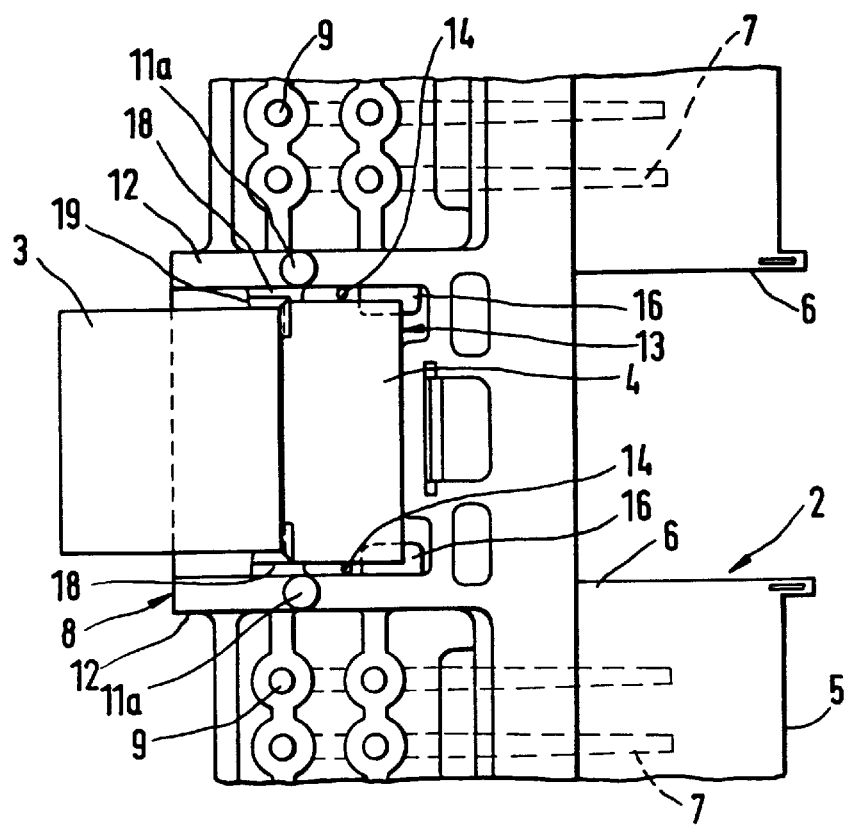
FIG. 2 shows a bottom view of the connector strip illustrated in FIG. 1.

The device according to the present invention has a connector strip 2 arranged on a p.c. board 1. The p.c. board 1 is fitted with components, with a high component 3 and a vibration-sensitive component 4 being positioned in the area of connector strip 2 on p.c. board 1.

Connector strip 2 has two plug connectors 5 and 6 with plug-in contacts 7, arranged parallel to p.c. board 1, which match the socket contacts (not shown) of a second connector strip, and a socket connector 8 with which the connector strip 2 is attached to p.c. board 1. Plug-in contacts 7 are each soldered in an electrically conductive manner onto components 3 and 4 arranged on p.c. board 1 via connector contact pads 9, which are soldered onto p.c. board 1. Socket connector 8 also has positioning pins 11 and snap-in pins 11a, which can be used to fasten connector strip 2 to p.c. board 1. This can be done either with a snap-in connection or a solder connection. Socket connector 8 has spacing elements 12 between which a cavity 13 is formed for holding high component 3 and vibration-sensitive component 4.

Vibration-sensitive component 4 has an essentially cylindrical outer shape and is attached to p.c. board 1 by its two lead wires 14. Two wedges 16 projecting from and molded onto spacing elements 12 in cavity 13, with a wedge clamping surface 17 inclined at an approximately 45 degree angle to the normal to p.c. board 1, are in contact with vibration-sensitive component 4 and press vibration-sensitive component 4 in the direction of p.c. board 1 and against the other high component 3, which serves as a stop. However, an additional wedge can also be used as the stop for vibration-sensitive component 4.

High component 3 is fixed in place on the back of connector strip 2 by two angle elements 18 so that part of high component 3 projects over the connector strip base. High component 3 is fixed in place by the soldered-on connector contacts and the two angle elements 18 to prevent vibrations and oscillations. Undersides 19 of angle elements 18 formed by two vertical webs are attached to high component 3 to more easily mount connector strip 2.

A seal 23 is provided to seal connector strip 2 against the enclosure, which is high in area 21 of connector strip 2 and flat in area 22 of p.c. board 1.

What is claimed is:

1. A device, comprising:
   a first component;
   a second component, the first and second components attached to a printed circuit board using connector contact pads and fasteners; and
   at least one connector strip positioned above a surface of the board and attached to the board,
   wherein the fasteners include structural elements molded onto the at least one connector strip, and
   wherein at least one of the first and second components is arranged and fixed in a first place, and the first place is between the structural elements and the board.

2. The device according to claim 1, wherein the at least one connector strip includes a plug connector positioned in a parallel manner with respect to the surface and a socket connector positioned between the board and the plug connector, the socket connector including spacing elements, and wherein a cavity is formed between the spacing elements, and the at least one of the first and second components is positioned in the cavity.

3. The device according to claim 1, wherein the structural elements include at least one wedge having a tapered end facing the surface, the tapered end clamping the second component in the first place.

4. The device according to claim 3, wherein a wedge clamping surface of the at least one wedge forms an approximately 45 degree angle with an axis which is normal to the surface.

5. The device according to claim 1, wherein the structural elements includes angle elements, and the first component is fixed between the angle elements along edges of the angle elements.

6. The device according to claim 5, wherein the angle elements are arranged in a parallel manner with respect to the surface.

7. The device according to claim 5, wherein the angle elements are gripped along the edges so that the angle elements are adapted to be pushed onto corners of the first component.

8. The device according to claim 1, wherein the structural elements include a fixing surface matching an outer shape of one of the first and second components.

9. The device according to claim 8, wherein the fixing surface includes a concave surface.

10. The device according to claim 1, wherein the at least one connector strip includes first and second plug connectors attached to a bracket, and wherein the structural elements are positioned between the first and second plug connectors in a cavity of the bracket.

11. The device according to claim 1, further comprising:
    a flat board enclosure including an elevated connector mounting area,
    wherein the first component is arranged in an area of the at least one connector strip.

12. The device according to claim 11, wherein the first component includes capacitors.

13. The device according to claim 10, wherein the first component includes relays.

14. The device according to claim 1, wherein the second component is fixed in the first place by the structural elements, the second component positioned entirely within a connector base surface of the at least one connector strip on the board.

* * * * *